United States Patent

Yano et al.

[11] Patent Number: 5,969,413
[45] Date of Patent: Oct. 19, 1999

[54] SEMICONDUCTOR DEVICE HAVING A TAB CHIP ON A TAPE CARRIER WITH LEAD WIRINGS PROVIDED ON THE TAPE CARRIER USED AS EXTERNAL LEADS

[75] Inventors: Keiichi Yano, Kawasaki; Kazuo Kimura, Tokyo; Hironori Asai; Jun Monma, both of Yokohama, all of Japan; Koji Yamakawa, State College, Pa.; Mitsuyoshi Endo, Ebina; Hirohisa Osoguchi, Chigasaki, both of Japan

[73] Assignee: Kabushiki Kaishi Toshiba, Japan

[21] Appl. No.: 08/855,931

[22] Filed: May 14, 1997

Related U.S. Application Data

[63] Continuation of application No. 08/534,784, Sep. 27, 1995, abandoned.

[30] Foreign Application Priority Data

Sep. 29, 1994 [JP] Japan .................................. 6-235581

[51] Int. Cl.⁶ .......................... H01L 23/02; H01L 23/48; H01L 23/12
[52] U.S. Cl. .......................... 257/673; 257/668; 257/666; 257/690; 257/671
[58] Field of Search .................................. 257/690, 666, 257/671, 673, 676, 668, 664

[56] References Cited

U.S. PATENT DOCUMENTS

| | | | |
|---|---|---|---|
| 4,659,611 | 4/1987 | Iwase et al. | 428/209 |
| 4,878,106 | 10/1989 | Sachs | 257/796 |
| 5,045,922 | 9/1991 | Kodama et al. | 257/712 |
| 5,067,007 | 11/1991 | Kanji et al. | 257/701 |
| 5,083,191 | 1/1992 | Ueda | 257/737 |
| 5,111,278 | 5/1992 | Eichelberger | 257/698 |
| 5,158,912 | 10/1992 | Kellerman et al. | 257/706 |
| 5,159,432 | 10/1992 | Ohkubo et al. | 257/705 |
| 5,165,986 | 11/1992 | Gardner et al. | 428/209 |
| 5,193,053 | 3/1993 | Sonobe | 257/676 |
| 5,245,215 | 9/1993 | Sawaya | 257/723 |
| 5,250,843 | 10/1993 | Eichelberger | 257/692 |
| 5,293,301 | 3/1994 | Tanaka et al. | 361/707 |
| 5,306,679 | 4/1994 | Shimoda et al. | 501/98 |
| 5,365,107 | 11/1994 | Kuraishi et al. | 257/673 |
| 5,424,250 | 6/1995 | Sawada | 257/788 |
| 5,442,231 | 8/1995 | Miyamoto et al. | 257/690 |
| 5,455,457 | 10/1995 | Kurokawa | 257/704 |
| 5,602,059 | 2/1997 | Horiuchi et al. | 438/15 |

FOREIGN PATENT DOCUMENTS 6-69275   3/1994   Japan .

*Primary Examiner*—Alexander Oscar Williams
*Attorney, Agent, or Firm*—Finnegan, Henderson, Farabow, Garrett & Dunner, L.L.P.

[57] ABSTRACT

A semiconductor chip is supported on a tape carrier provided with lead wirings. The semiconductor chip is electrically connected to the lead wirings. The semiconductor chip of this quality is bonded in combination with the pe carrier to an aluminum nitride substrate. The lead wirings provided on the carrier combine the two functions as an internal lead and an external lead. The semiconductor package of such a structure as is described above allows multi-terminal connection by the narrowing of pitches between the leads and permits provision of a miniature package excelling in the heat-radiating property. Alternatively, the lead wirings supported on the tape carrier and electrically connected to the semiconductor chip are utilized as internal leads. For the external leads, such lead frames as are bonded to the aluminum nitride substrate are used. The lead frames are electrically connected to the internal leads provided in the tape carrier.

5 Claims, 5 Drawing Sheets

SEMICONDUCTOR DEVICE HAVING A TAB CHIP ON A TAPE CARRIER WITH LEAD WIRINGS PROVIDED ON THE TAPE CARRIER USED AS EXTERNAL LEADS

This application is a continuation of application Ser. No. 08/534,784, filed Sep. 27, 1995, now abandoned.

BACKGROUND OF THE INVENTION

1. Field of the Invention

This invention relates to a semiconductor package.

2. Description of the Related Art

Generally, plastic packages, metallic packages, and ceramic packages are used for packaging semiconductor chips. In regard to structure, DIP (dual inline package) and QFP (quad flat package) both using a lead frame, PGA (pin grid array) using a lead pin, and BGA (ball grid array) using solder bumps as input and output terminals are known.

In these package structures, the packages which use a lead frame enjoy simplicity of structure and allow inexpensive manufacture and, therefore, have been finding extensive utility in various kinds of semiconductor chips. Especially, the QFP is profusely used because it admits an increase in the number of input and output signals to a considerable extent and exclusively fits surfacial packaging.

Recently, the rapid advance in the technologies for the manufacture of semiconductors has come to urge increasingly high integration of semiconductor chips and compel incessant growth in the number of input and output signals per chip. As a natural consequence, the packages to be used for containing such a highly integrated semiconductor chip are expected to permit connection of semiconductor chip to multi-terminal channels at a narrow pitch.

In the conventional QFP, however, the lead frame used therein is manufactured by etching a thin sheet of such a Fe—Ni type alloy as 42 wt % Ni—Fe or 29 wt % Ni-16 wt % Co—Fe. The QFP, therefore, is at a disadvantage in limiting the lead pitch to the neighborhood of 100 μm and permitting no further increase either in the size of pitch or in the number of terminals. If the number of terminals is increased at such a lead pitch as is mentioned above, the package itself will naturally grow in volume and inevitably fail to satisfy the persistent demand for miniaturization of various electronic devices. Further, since the increase under discussion adds proportionately to the total length of wirings to be distributed in the package, it will inevitably entail a delay of signal. The lead frame made of the Fe—Ni type alloy mentioned above is also deficient in electrical properties. When the signal to be handled operates at a very high speed, therefore, the voltage level of the output signal will be lowered and the noise level thereof will be heightened as an inevitable consequence.

As means to package a semiconductor chip which has a large number of input and output terminals, a method which comprises joining the semiconductor chip to a tape carrier, popularly called a tape of the TAB (tape automated bonding), and containing the TAB chip in a given package has been known in the art. The package which uses the conventional TAB chip, however, is at a disadvantage in proving structurally expensive because it necessitates connection between a connecting pad which is connected through the medium of internal wirings to input and output pins serving as external connecting terminals and lead wires which are provided in the tape carrier.

The art is not ignorant of such an inexpensive package as has a TAB chip itself sealed therein with resin. The package of this structure has a conspicuously low capacity for radiating heat and hardly admits such a highly integrated semiconductor chip as mentioned above. Further, for the package which uses the TAB chip, a structure having a metallic sheet attached fast to the TAB tape part for the purpose of preventing the so-called lead skews, i.e. bends and warps in the lead wire, has been proposed (JP-A-06-69,275). This structure, however, is at a disadvantage in attaining no improvement in the capacity for heat radiation and entailing the possibility of short-circuiting the lead wires with the metallic sheet. Further, the metallic sheet used in the package causes an erroneous operation in the package as by picking up an external noise by virtue of the so-called antenna effect. The structure also poses various problems because the metallic sheet gathers rust and sustains warps due to low rigidity.

Such conventional packages as QFP which use a lead frame as described above are at a disadvantage in imposing a limit on the lead pitch and hampering all efforts to narrow the pitch further and permit an increase in the number of terminals. The packages which use a TAB known as means to package a semiconductor chip having numerous input and output terminals are at a disadvantage in being structurally expensive, possessing an unduly low capacity for heat radiation, and suffering ready occurrence of short circuits and erroneous operations.

SUMMARY OF THE INVENTION

An object of this invention, therefore, is to provide an inexpensive semiconductor package which allows multi-terminal connection owing to the narrowing of pitches between the adjacent leads and, at the same time, excels in the heat-radiating property. Another object of this invention is to provide a semiconductor package which is small and excellent in electrical properties.

The first semiconductor package in this invention is characterized by comprising a tape carrier possessed of lead wirings concurrently serving as external leads, a semiconductor chip supported on the tape carrier and electrically connected to the lead wirings, and an aluminum nitride substrate having bonded thereto the semiconductor chip in combination with the tape carrier.

The second semiconductor package in this invention is characterized by comprising a tape carrier possessed of lead wirings, a semiconductor chip supported on the tape carrier and electrically connected to the terminal parts on one side of the lead wirings, an aluminum nitride substrate having bonded thereto the semiconductor chip, and a lead frame bonded to the outer peripheral side of the aluminum nitride substrate, electrically connected to the terminal parts on the other side of the lead wirings, and adapted to serve as external leads.

In the first semiconductor package, the semiconductor chip or so-called TAB chip supported on the tape carrier possessed of lead wirings is bonded to the aluminum nitride substrate and, at the same time, the lead wirings provided on the tape carrier are utilized as external leads. In the second semiconductor package, the semiconductor chip or so-called TAB chip supported on the tape carrier possessed of lead wirings is bonded to the aluminum nitride substrate and, at the same time, the lead frame bonded in advance to the outer peripheral side of the aluminum nitride substrate and adapted to serve as an external lead and the semiconductor chip are electrically connected to the lead wirings provided on the tape carrier.

Since the lead wirings used for the TAB tape are capable of receiving fine etching, the semiconductor chip and the lead wirings can be connected through multiple terminals with narrow pitches. Further, since the semiconductor chips themselves are bonded to the aluminum nitride substrate, they are capable of efficiently diffusing the heat from the semiconductor chip and furnishing the semiconductor package with a high heat-radiating property. Besides, since the aluminum nitride substrate used in the package possesses an insulating property, the possibility of the lead wirings being short-circuited to the ground surface or being disturbed by an external noise is nil.

Since the package as a covering is simple in structure and rich in rigidity, it allows the package as a finished product to enjoy enhanced reliability of performance and permit a reduction in the cost of production. Particularly, the first semiconductor package permits miniaturization of the package in volume and effectively promotes the enhancement of reliability of the package in the course of the miniaturization thereof.

DESCRIPTION OF THE PREFERRED EMBODIMENTS

Now, the embodiments of this invention will be described below with reference to the accompanying drawings.

Figure 1:
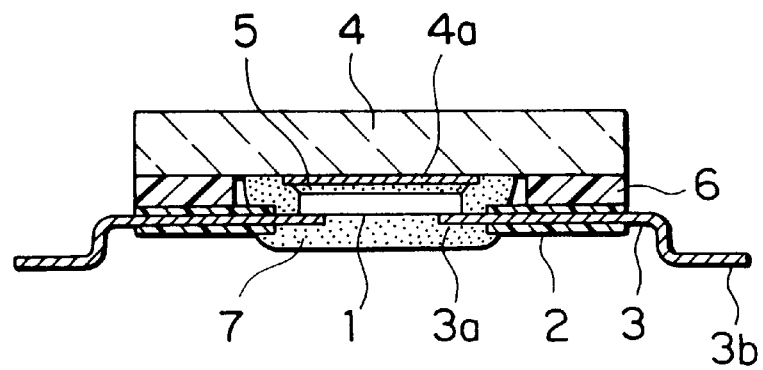
FIG. 1 is a cross section showing as a model the structure of a semiconductor package as one embodiment of this invention.

FIG. 1 is a cross section showing the structure of a semiconductor package as one embodiment of this invention. In the diagram, 1 stands for a semiconductor chip. This semiconductor chip 1 is a so-called TAB chip. Specifically, the semiconductor chip 1 is supported on a tape carrier (TAB tape) 2 such as an insulating resin film and, at the same time, electrically connected to an inside terminal part 3a of a lead wiring 3 provided in advance in the tape carrier 2. The connection of the semiconductor chip 1 to the lead wiring 3 is effected by means of a bump (not shown) in the same manner as in the ordinary TAB chip.

The lead wiring 3 mentioned above is a copper type lead made of copper or a copper alloy which is used in the ordinary TAB tape. It, therefore, can be etched very finely in the same manner as in the ordinary TAB chip. To be specific, it allows realization of a lead pitch falling in the approximate range of from 0.05 to 0.5 mm. By the use of this lead wiring 3, the semiconductor chip 1 and the lead wiring 3 can be easily connected through multiple terminals with narrow pitches.

The semiconductor chip 1 of such a structure as described above has the rear surface thereof bonded through the medium of a bonding agent 5 such as soldering material, soft solder, or a glass type adhesive agent to a chip-mounting part (metallized part) 4a provided on the rear surface side of an aluminum nitride substrate 4. The tape carrier 2 part is bonded fast to the outer peripheral part of the aluminum nitride substrate 4 through the medium of an insulating adhesive agent 6.

The visible shape of the lead wiring 3 is so set in advance as to be larger than that of the aluminum nitride substrate 4. The outside terminal part 3b of the lead wiring 3 functions as an external lead because it protrudes to the outer side of the aluminum nitride substrate 4. In other words, the lead wiring 3 which is provided on the tape carrier 2 combines the two functions as an internal lead and an external lead. The outside terminal part 3b of the lead wiring 3 is connected to a wiring layer on the packaging board side such as of a substrate for a printed circuit.

The semiconductor chip 1 is sealed such as with a potting resin 7 and is protected thereby.

The semiconductor package of such a structure as described above allows easy addition to the number of terminals in the semiconductor chip 1 because the lead wiring 3 which allows the pitches between the leads provided in the tape carrier (TAB tape) 2 to be narrowed is utilized as a lead similar to the lead frame of the conventional QFP.

Thus, the semiconductor chip 1 and the leads can be easily connected through multiple terminals with narrow pitches. The necessity for effecting connection by the use of the conventional wire bonding, for example, can be obviated by the package of this invention because the lead wiring 3 electrically connected to the semiconductor chip 1 is utilized in its unmodified form as an external lead.

Figure 2:
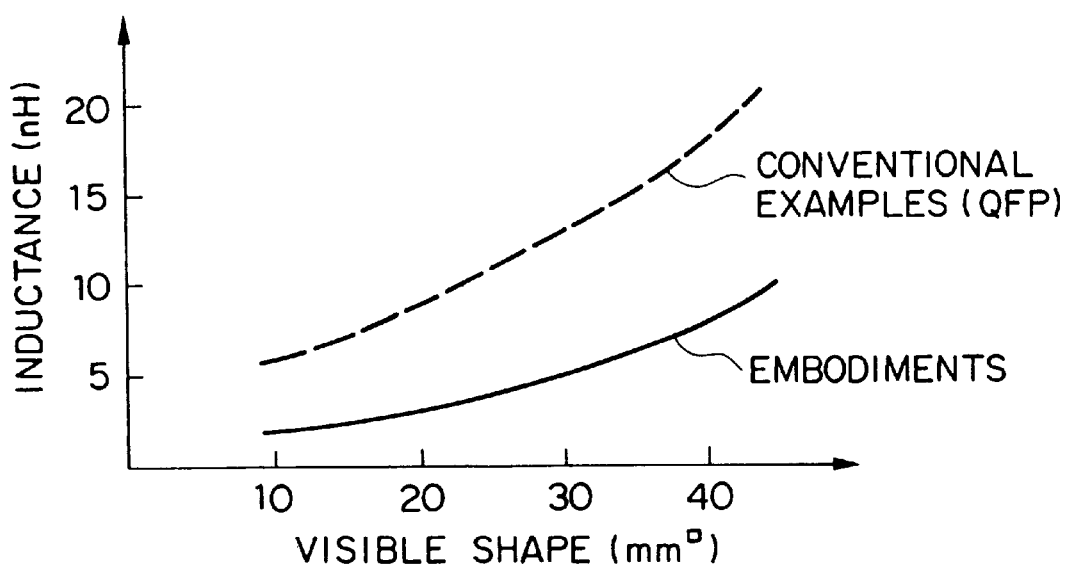
FIG. 2 is a diagram showing the relation between the visible shape and the inductance of the semiconductor package shown in FIG. 1 in comparison with that of the conventional QFP package.
Figure 3:
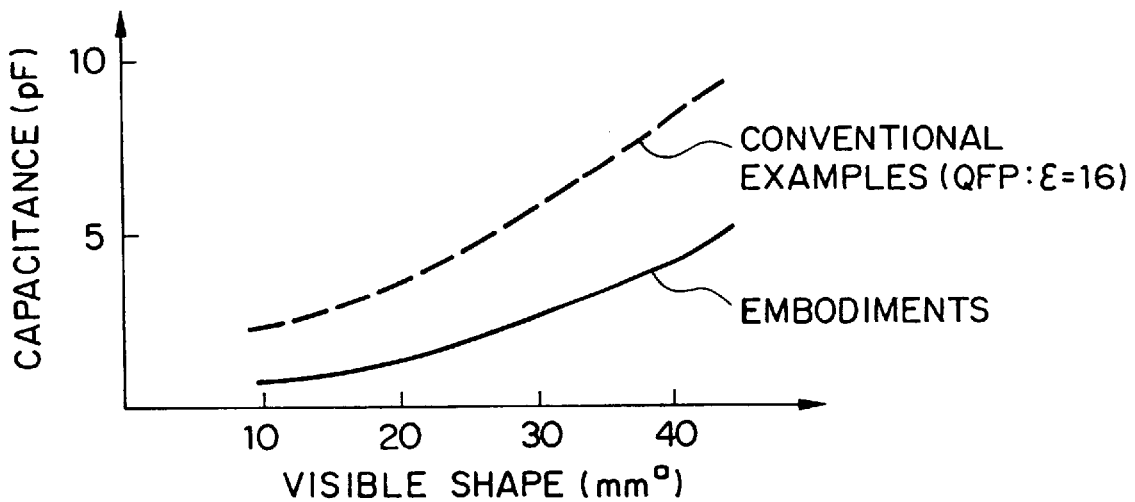
FIG. 3 is a diagram showing the relation between the visible shape and the capacitance of the semiconductor package shown in FIG. 1 in comparison with that of the conventional QFP package.
Figure 4:
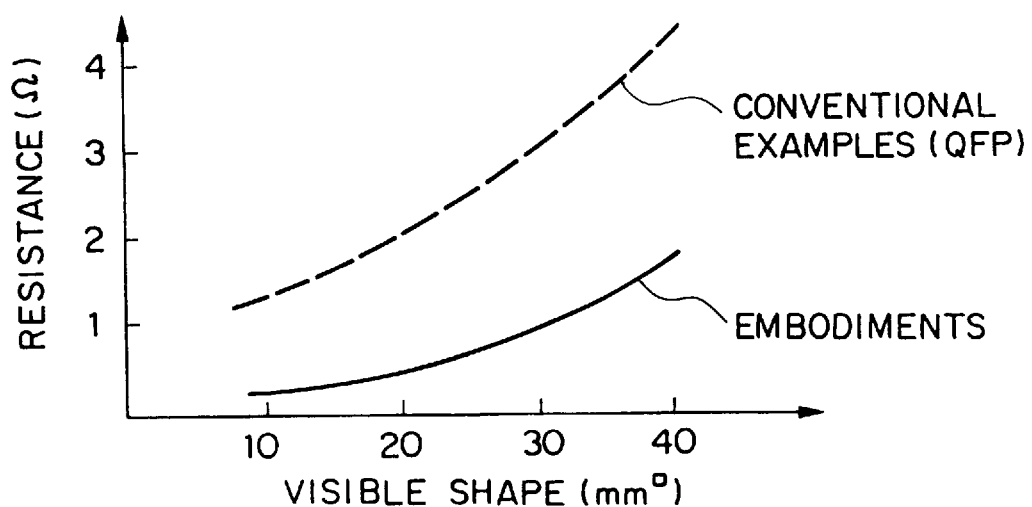
FIG. 4 is a diagram showing the relation between the visible shape and the resistance of the semiconductor package shown in FIG. 1 in comparison with that of the conventional QFP package.

The semiconductor chip 1 can be directly connected to such packaging boards as the substrate for a printed circuit with lead wirings 3 made of copper or a copper alloy. The improvement of electrical properties of the present semiconductor package, therefore, can be promoted. FIG. 2, FIG. 3, and FIG. 4 show the electrical properties of the semiconductor package of the present embodiment (indicated with a continuous line) in comparison with those of the semiconductor package (using a lead frame of 42 wt % Ni—Fe) of the conventional QFP structure (indicated with a broken line). It is remarked from these diagrams that the semiconductor package of the present invention excels invariably in inductance, capacitance, and resistance. Since the semiconductor chip 1 and the lead wiring 3 are bonded to the aluminum nitride substrate 4 which possesses an insulating property, the possibility of the lead wiring 3 being short-circuited to the ground surface and being disturbed by an external noise is nil.

Figure 5:
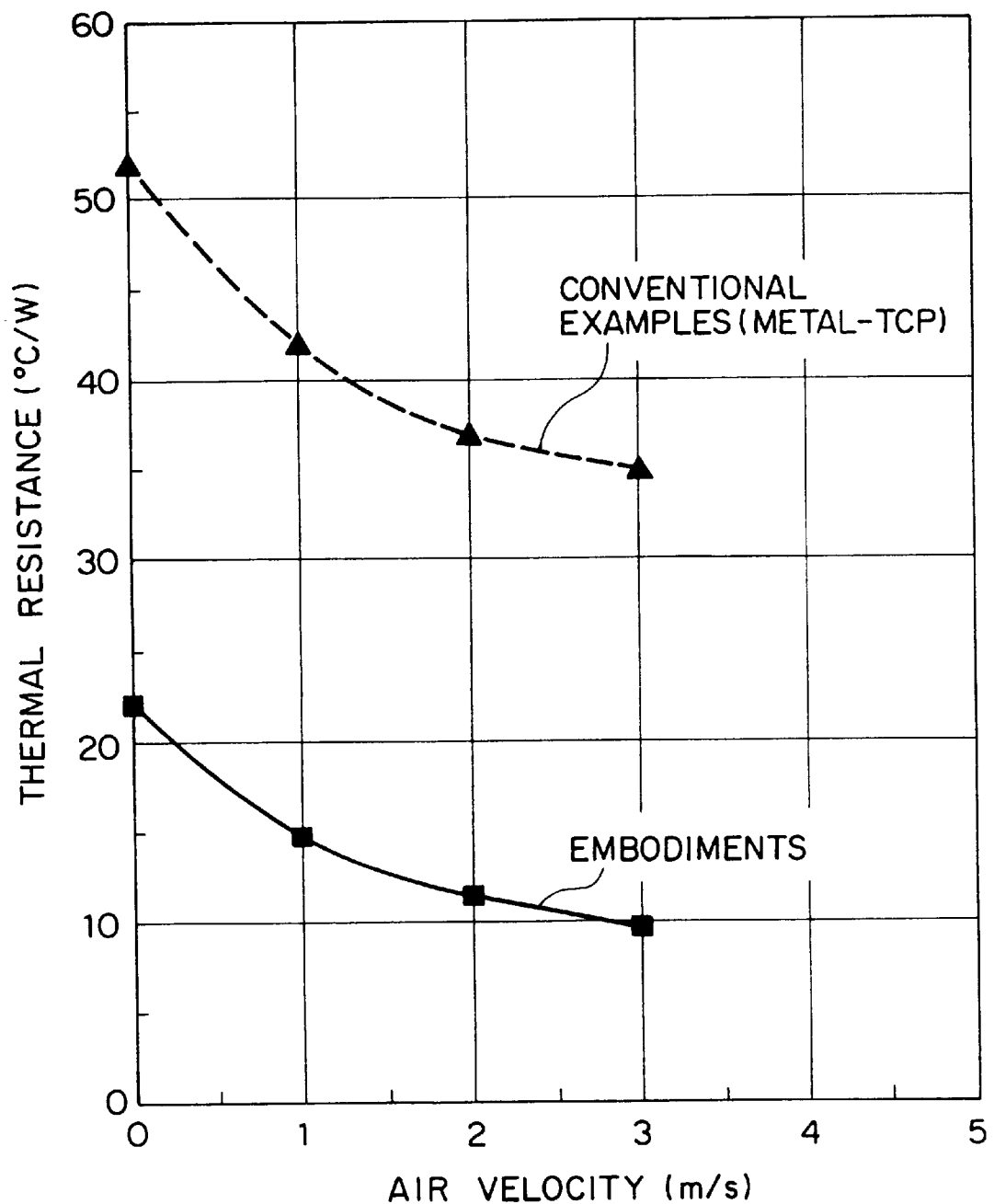
FIG. 5 is a diagram showing the thermal resistance of the semiconductor package shown in FIG. 1 in comparison with that of the conventional TAB package.

The semiconductor package is capable of securing perfect heat-radiating property because the semiconductor chip 1 is bonded to the aluminum nitride substrate 4 having a high heat-radiating property. FIG. 5 shows the thermal resistance of the semiconductor package of the present embodiment (indicated with a continuous line) in comparison with that of the package of a structure such as has a metallic sheet joined fast to the conventional TAB tape part (Metal-TCP)

(indicated with a broken line). It is noted from FIG. 5 that the semiconductor package of this invention offers only small thermal resistance and excels in the heat-radiating property.

Figure 6:
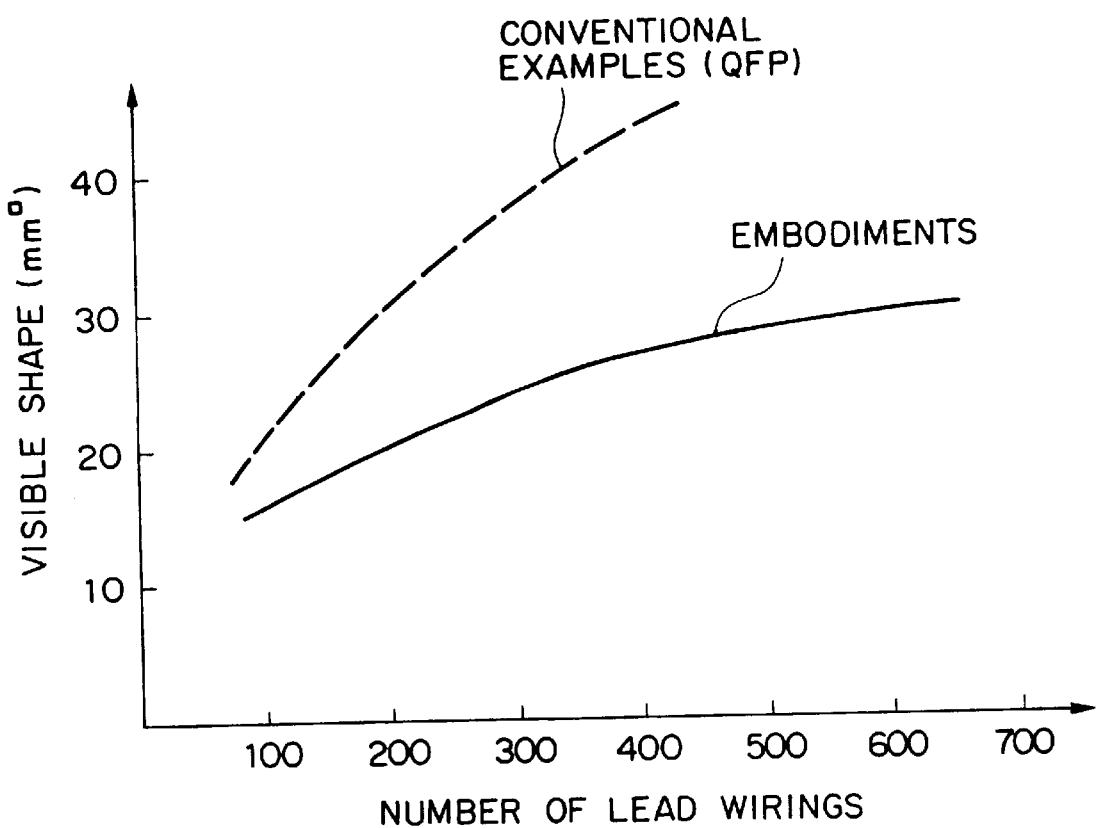
FIG. 6 is a diagram showing the relation between the number of lead wirings and the visible shape of the semiconductor package shown in FIG. 1 in comparison with that of the conventional QFP package.

The package structure itself is extremely simple and, at the same time, the package shape (visible shape) can be easily miniaturized because the lead wirings 3 used therein permit their pitches to be narrowed and the lead structure is simplified. The aluminum nitride substrate 4 in the form of a single sheet is particularly effective in simplifying the package structure. This simplification of the package structure allows the cost of manufacture to be decreased. FIG. 6 shows the relation between the number of leads (lead pitch: 0.25 mm) and the visible shape of the semiconductor package of the present embodiment (indicated with a continuous line) in comparison with the semiconductor of the conventional QFP structure (lead pitch: 0.5 mm) (indicated with a broken line). It is clearly noted from FIG. 6 that the semiconductor package of this invention is capable of effective miniaturization.

Figure 7:
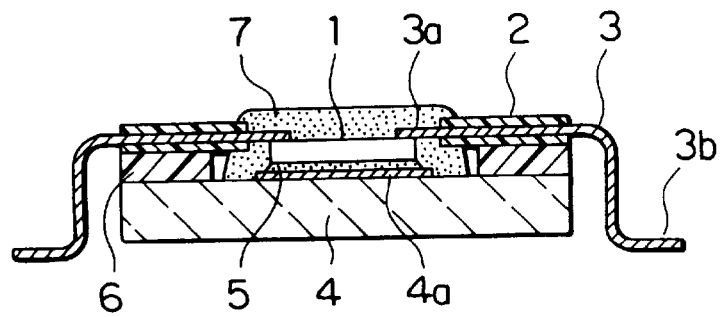
FIG. 7 is a cross section showing one modification of the semiconductor package shown in FIG. 1.

The embodiment described above concerns a so-called face-down type package structure having the semiconductor chip 1 bonded to the rear surface side of the aluminum nitride substrate 4. It should be noted that the semiconductor package of this invention is not limited to this particular package structure. For example, the semiconductor package of this invention can be embodied in a so-called face-up type package structure having the semiconductor chip 1 bonded to the front surface side of the aluminum nitride substrate 4 as shown in FIG. 7. The basic structure in this case is similar to the face-down type package structure and is capable of manifesting the same effect.

Figure 8:
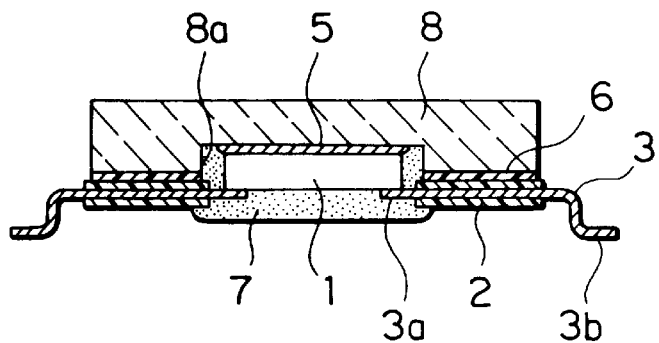
FIG. 8 is a cross section showing another modification of the semiconductor package shown in FIG. 1.
Figure 9:
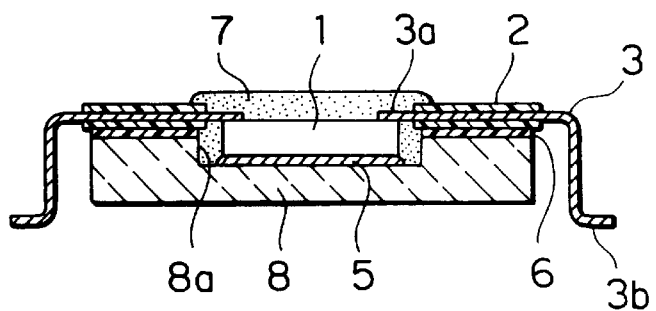
FIG. 9 is a cross section showing yet another modification of the semiconductor package shown in FIG. 1.

An aluminum nitride substrate 8 which is provided with a cavity 8a as shown in FIG. 8 and FIG. 9 can be also used herein. When the cavity type aluminum nitride substrate 8 is adopted, the basic structure thereof is identical to the package structure shown in FIG. 1 and is capable of manifesting the same effect. In FIG. 8 and FIG. 9, like parts found in FIG. 1 are denoted by like reference numerals.

Then, another embodiment of this invention will be described below with reference to FIG. 10.

Figure 10:
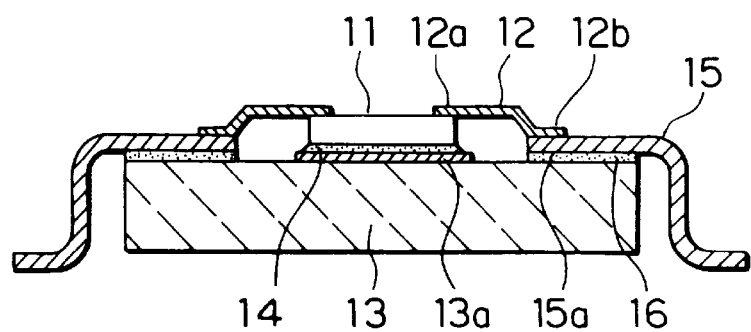
FIG. 10 is a cross section showing as a model the structure of the semiconductor package as another embodiment of this invention.

A semiconductor chip 11 in the semiconductor package shown in FIG. 10 is a TAB chip supported on a tape carrier such as of an insulating resin film in the same manner as in the embodiment described above. The semiconductor chip 11 is electrically connected with a bump (not shown) to an inside terminal part 12a of a lead wiring 12 which is provided in advance on the tape carrier. The lead wirings 12 which are formed of a copper type lead and the semiconductor chip 11, therefore, can be connected through multiple terminals with narrow pitches similarly to the countertypes in the embodiment cited above.

The semiconductor chip 11 has the rear surface thereof bonded through the medium of a bonding agent 14 such as soldering material, soft solder, or a glass type adhesive agent to a chip-mounting part (metallized part) 13a provided on the front surface side of an aluminum nitride substrate 13. A lead frame 15 destined to serve as an external lead is bonded fast through the medium of such an insulating bonding agent 16 as a resin type bonding agent or a glass type bonding agent in advance to the outer peripheral side of the aluminum nitride substrate 13. The use of a metallic type bonding agent in this case is made allowable by preparatorily subjecting the outer surface of the lead frame 15 to an insulating treatment such as the treatment of surface oxidation.

An Fe—Ni type alloy can be used as the material for the lead frame 15. Appropriately, the lead frame 15 is made of copper or a copper alloy like the lead wiring 12.

The use of this material can promote the improvement of electrical properties of the semiconductor package. In this case, it suffices to bond the lead frame 15 with a resin type bonding agent to the aluminum nitride substrate 13.

Then, the other terminal part (outer side terminal part) 12b of the lead wiring 12 mentioned above is so shaped as to conform to the pitch of the lead frame 15. The outer side terminal part 12b of the lead wiring 12 is electrically connected to the inner side terminal part 15a of the lead frame 15. To be specific, the semiconductor chip 11 and the lead frame 15 are electrically connected through the medium of the lead wirings 12 provided on the tape carrier and the lead wirings 12 function as an internal lead. The semiconductor chip 11 can be airtightly sealed with a lid like the conventional QFP chip. Alternatively, it may be sealed as with a potting resin similarly to the semiconductor chip in the embodiment described previously.

The semiconductor package of such a structure as described above allows easy addition to the number of terminals in the semiconductor chip 11 because the lead wiring 12 which allows the pitches between the leads provided in the tape carrier (TAB tape) to be narrowed is utilized as an internal lead between the semiconductor chip 11 and the lead frame 15. Thus, the semiconductor chip 11 and the lead frame 12 can be easily connected through multiple terminals with narrow pitches.

Since the basic structure of the package is such as uses the lead frame similarly to that in the conventional QFP and the aluminum nitride substrate 13 for securing a heat-radiating property is in the form of a single sheet, the semiconductor package permits the cost of production to be lowered as compared with the package of the multilayer structure (using pins as input and output terminals, for example) using the conventional TAB chip. As respects the heat-radiating property of the semiconductor package, the aluminum nitride substrate 4 of such quality as described above enables the semiconductor package to secure a perfect heat-radiating property. Owing to the use of the lead frame 15 as an external lead, the possible exaltation of the wiring resistance by the thin lead wiring (TAB lead) 12 can be curbed.

As demonstrated by the embodiments cited above, the present invention allows multi-terminal connection by the narrowing of pitches between leads and permits provision of an inexpensive semiconductor package excelling in the heatradiating property. The first semiconductor package further allows miniaturization of the package and promotes enhancement of electrical properties. The second semiconductor package is capable of curbing the otherwise possible aggravation of wiring resistance.

What is claimed is:

1. A semiconductor package, comprising:
   a tape carrier comprising an insulating film and lead wirings provided on said insulating film, the lead wirings comprising plural leads each having an inside terminal part serving as an internal lead and an outside terminal part extending from the inside terminal part concurrently serving as external leads;
   a semiconductor chip electrically bonded to said inside terminal part so as to be supported on the tape carrier, the semiconductor chip being sealed with resin; and
   an aluminum nitride substrate having a shape of a single sheet said semiconductor chip in combination with said tape carrier, wherein said aluminum having a metallized part for bonding said semiconductor chips,
   wherein an outer peripheral part of said tape carrier is fast bonded to said aluminum nitride substrate through an insulating adhesive agent, said semiconductor chip is bonded to the metallized part of said aluminum nitride substrate, and the outside terminal part of the lead wiring protrudes to the outer side of the aluminum nitride substrate.

2. The semiconductor package according to claim 1, wherein said lead wirings are possessed of a copper type lead.

3. The semiconductor package according to claim 1, wherein said lead wirings are bonded fast through the medium of the insulating adhesive agent to said aluminum nitride substrate.

4. A semiconductor package, comprising:

a tape carrier comprising an insulating film and lead wirings provided on said insulating film, the lead wirings comprising plural leads each having an inside terminal part serving as an internal lead and an outside terminal part extending from the inside terminal part concurrently serving as external leads;

a semiconductor chip electrically bonded to said inside terminal part so as to be supported on the tape carrier, the semiconductor chip being sealed with resin; and an aluminum nitride substrate having a cavity in which said semiconductor chip is received and bonded, wherein an outer peripheral part of said tape carrier is fast bonded to said aluminum nitride substrate through an insulating adhesive agent, and the outside terminal part of the lead wiring protrudes to the outer side of the aluminum nitride substrate.

5. The semiconductor package according to claim 4, wherein said lead wirings are bonded through the medium of the insulating adhesive agent to said aluminum nitride substrate.

* * * * *

UNITED STATES PATENT AND TRADEMARK OFFICE
CERTIFICATE OF CORRECTION

PATENT NO.: 5,969,413

DATED: October 19, 1999

INVENTOR(S): Keiichi Yano et al.

It is certified that an error appears in the above-identified patent and that said Letters Patent is hereby corrected as shown below:

Claim 1, column 6, line 65, "chips" should read --chip--.

Signed and Sealed this

Twenty-fifth Day of July, 2000

Q. TODD DICKINSON

*Attest:*

*Attesting Officer*    Director of Patents and Trademarks